United States Patent [19]
Choi

[11] Patent Number: 5,569,939
[45] Date of Patent: Oct. 29, 1996

[54] LIGHT EMITTING DIODE FABRICATED WITH RESISTORS FOR VARIABLE LIGHT INTENSITY

[75] Inventor: Seong C. Choi, Anyang, Rep. of Korea

[73] Assignee: Goldstar Co., Ltd., Seoul, Rep. of Korea

[21] Appl. No.: 379,103

[22] Filed: Jan. 27, 1995

Related U.S. Application Data

[63] Continuation of Ser. No. 991,007, Dec. 16, 1992, abandoned.

[30] Foreign Application Priority Data

Dec. 18, 1991 [KR] Rep. of Korea ............... 91-23361

[51] Int. Cl.$^6$ .................. H01L 29/06; H01L 27/15; H01L 33/00
[52] U.S. Cl. .................. 257/94; 257/13; 257/81; 257/82; 257/84; 257/85; 257/86; 257/90; 257/96; 257/97
[58] Field of Search .................. 257/13, 81, 82, 257/84, 85, 86, 90, 94, 96, 97

[56] References Cited

U.S. PATENT DOCUMENTS 4,212,020  7/1980  Yariv et al. .................. 257/97
5,075,239  12/1991  Tegude .................. 257/94
5,283,447  2/1994  Olbright et al. .................. 257/97

FOREIGN PATENT DOCUMENTS 63-288083  11/1988  Japan.

*Primary Examiner*—Sara W. Crane
*Assistant Examiner*—Valencia Martin Wallace
*Attorney, Agent, or Firm*—Pennie & Edmonds

[57] ABSTRACT

A light emitting diode (LED) and resistors for varying the light intensity of the LED are formed on a single chip. Each of the LED portion and the resistor portion includes an active layer and a clad layer successively deposited on a substrate of the chip. The substrate may be doped with one of P-type dopant and N-type dopant and the clad layer with the other of P and Y-type dopants. A first and second electrodes are formed on an exposed surface of the substrate and the clad layer of the LED portion respectively. A plurality of resistor electrodes are formed on the clad layer of the resistor portion. It is preferable to have different spacing between the resistor electrodes to form variable resistances.

11 Claims, 4 Drawing Sheets

F I G. 5
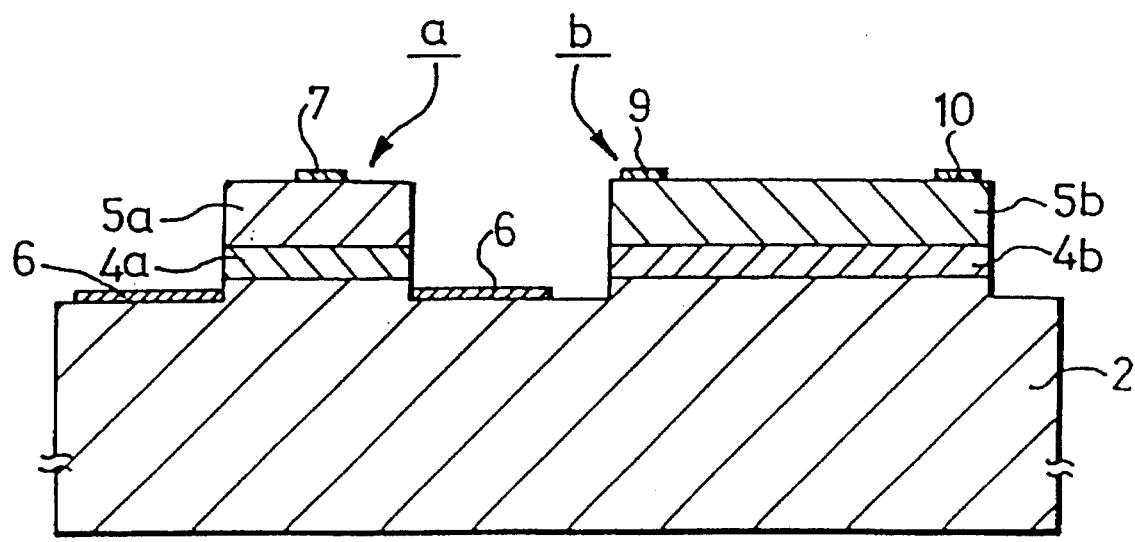
F I G. 6
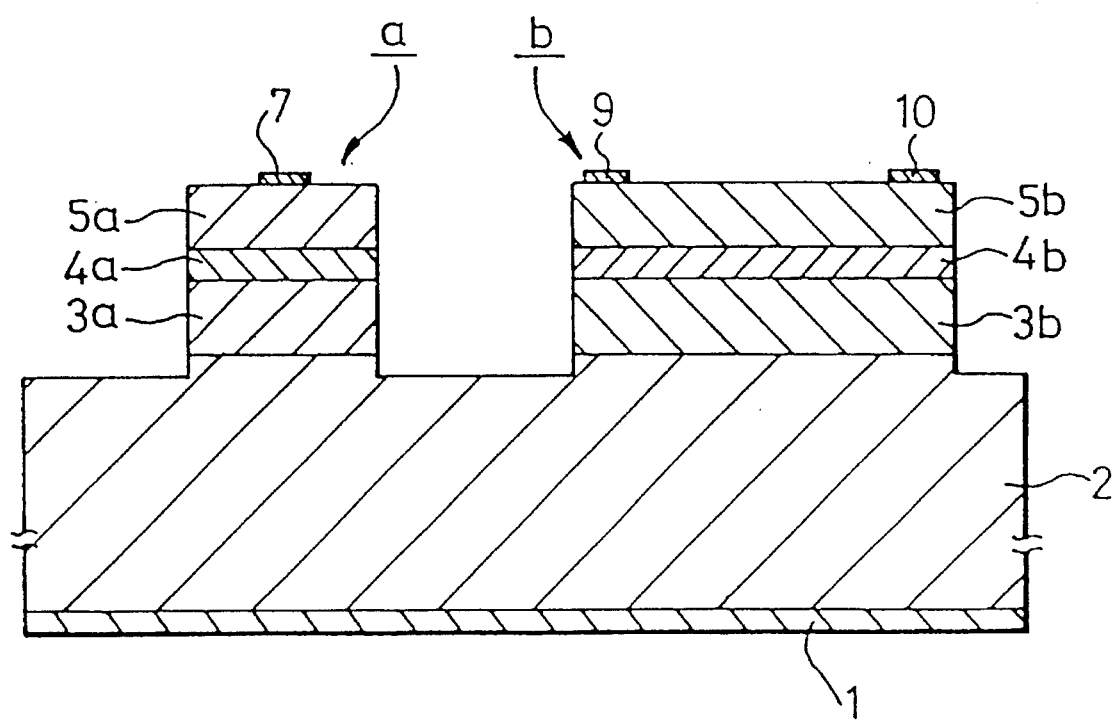

LIGHT EMITTING DIODE FABRICATED WITH RESISTORS FOR VARIABLE LIGHT INTENSITY

This is a continuation of application Ser. No. 07/991,007, filed Dec. 16, 1992, now abandoned.

BACKGROUND OF THE INVENTION

The present invention relates to a light emitting diode(LED) fabricated with resistors for variable light intensity, and more particularly, to an LED fabricated with resistors for variable light intensity so that, if the LED, as being fabricated into one chip, not as a lamp type, is employed in such device as the brake light of a motor vehicle which requires at least two levels of light intensity, its product life can be increased and the cost of the product can be reduced.

DESCRIPTION OF THE PRIOR ART

Conventionally, the LED has been used as a brake light for high top mount on a car. The overall driving circuitry thereof, however, is complicated in comparison with that of the LED according to the present invention, which is fabricated into one chip together with resistors, because the conventional brake light circuitry requires separate resistors to be connected to the LED so that the LED can emit light with at least two levels of intensity. Accordingly, the LED has rarely been used as a rear lamp for indicating the braking state of a car.

It is essential that most circuits utilizing the LED should employ hybrid resistors in order to control the current through the LED, and also separate resistors in order to protect the LED from damage.

That is, separate resistors are required in order to limit the current as much as necessary which flows to the LED from the power supply for driving the LED. Further, a switch or a switching device should be incorporated in the driving circuit in order to drive the LED with its light intensity varied. Thus, the conventional driving circuit may be highly complicated in structure, causing the manufacturing cost thereof also to be greatly increased.

SUMMARY OF THE INVENTION

The present invention has been made to overcome the problems involved in the prior art. It is an object of the present invention to provide an LED fabricated with resistors for variable light intensity, which is capable of controlling the light intensity of the LED with at least two levels, through one chip fabrication of the LED and the resistors by utilizing the manufacturing process of the LED having the conventional single or double heterostructure and by utilizing an etching process for providing a resistance region.

BRIEF DESCRIPTION OF THE DRAWINGS

These and other features of the present invention will now be described in detail with reference to the accompanying drawings, in which:

FIG. 5 is a cross-sectional view similar to FIG. 2, showing the LED with a single heterostructure of the present invention;

FIG. 6 is a cross-sectional view similar to FIG. 2, but having one of the LED electrode at the opposite side of the substrate.

DETAILED DESCRIPTION OF THE PREFERRED EMBODIMENTS

Preferred embodiments of the present invention will now be described, referring to FIGS. 1 to 7.

Figure 1:
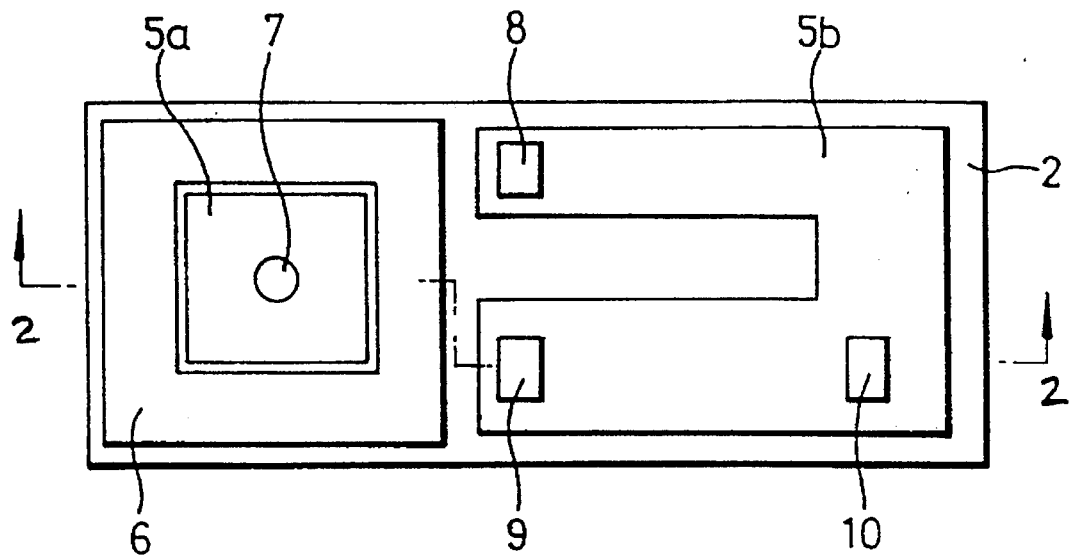
FIG. 1 is a plan view of the LED having the double heterostructure illustrating one embodiment of the present invention.
Figure 2:
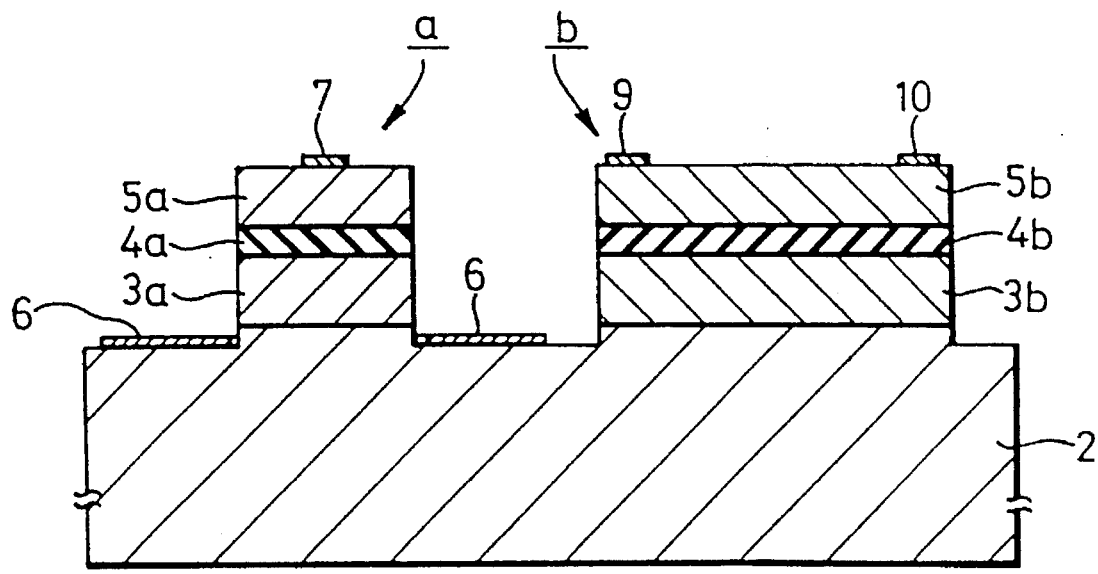
FIG. 2 is a cross-sectional view taken along line A—A' in FIG. 1.

Referring to FIGS. 1 and 2 showing the LED having double heterostructure according to one embodiment of the present invention, an LED portion a includes a P clad layer 3a, an active layer 4a and an N clad layer 5a which are successively laminated on one side of the upper surface of a P type substrate 2 with predetermined thicknesses respectively. A resistor portion b includes another P clad layer 3b, another active layer 4b and another N clad layer 5b which are successively laminated on the other side of the upper surface of the P type substrate 2, being separated from the LED portion a.

In an LED having single heterostructure (not illustrated), the P clad layers 3a and 3b may be excluded from the above-described structure. The efficiency of single heterostructure is reduced by half in comparison with that of double heterostructure.

On the upper surface of the P type substrate 2, a P type electrode terminal 6 is provided, surrounding the P clad layer 3a, and, on the upper surface of the N clad layer 5a of the LED portion a, an N type electrode terminal 7 is provided. A plurality of resistor terminals 8 to 10 are provided on the upper surface of the N clad layer 5b of the resistor portion b so that the resistor terminals are respectively positioned to define the corresponding resistance values different from one another. The resistor portion b is exclusively used as a resistance region while the LED portion a functions as the LED.

Figure 3:
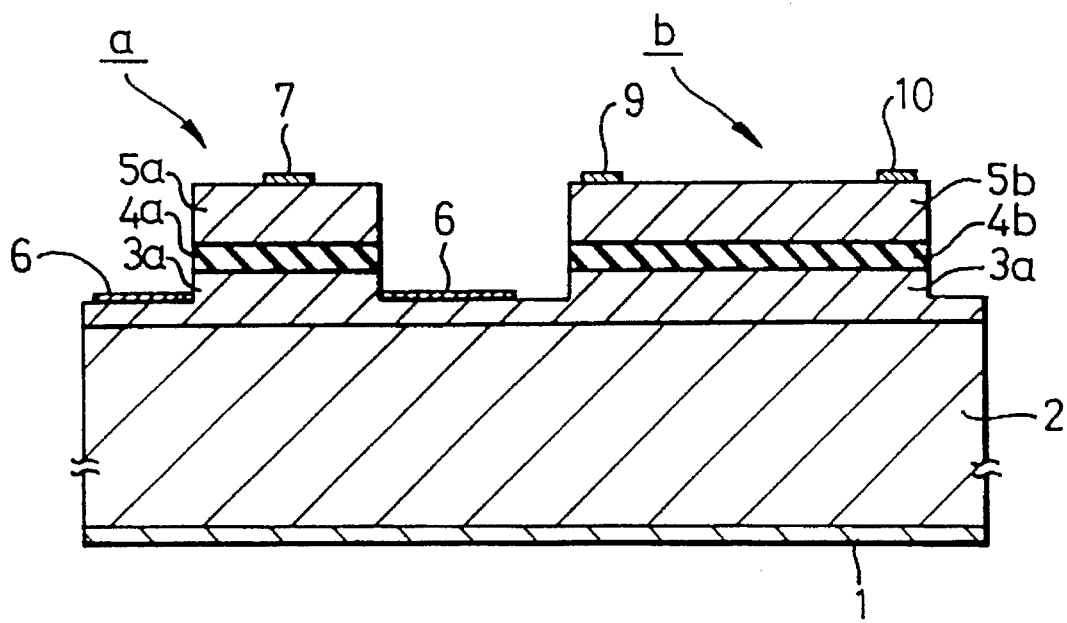
FIG. 3 is a cross-sectional view similar to FIG. 2, showing another embodiment of the present invention.

Referring to FIG. 3 showing another embodiment of the invention, the active layers 4a and 4b are completely exposed and the P clad layers 3a and 3b are partially exposed. The P type electrode terminal 6 is provided on the upper surface of the remaining P clad layer which is not etched. Also, as shown in FIG. 3, a selective P type electrode terminal 1 may be provided on the bottom surface of the P type substrate 2 in order to be selectively used. Such selective P type electrode terminal 1 may also be applicable to the embodiment of FIG. 2. However, it is not applicable to the case of a semi-insulating substrate.

The operation and effect of the present invention constructed as mentioned above will now be explained with reference to FIGS. 1 to 4.

The LED according to the present invention may be adapted for use in devices that require two levels of light intensity such as the brake light of a car.

Figure 4:
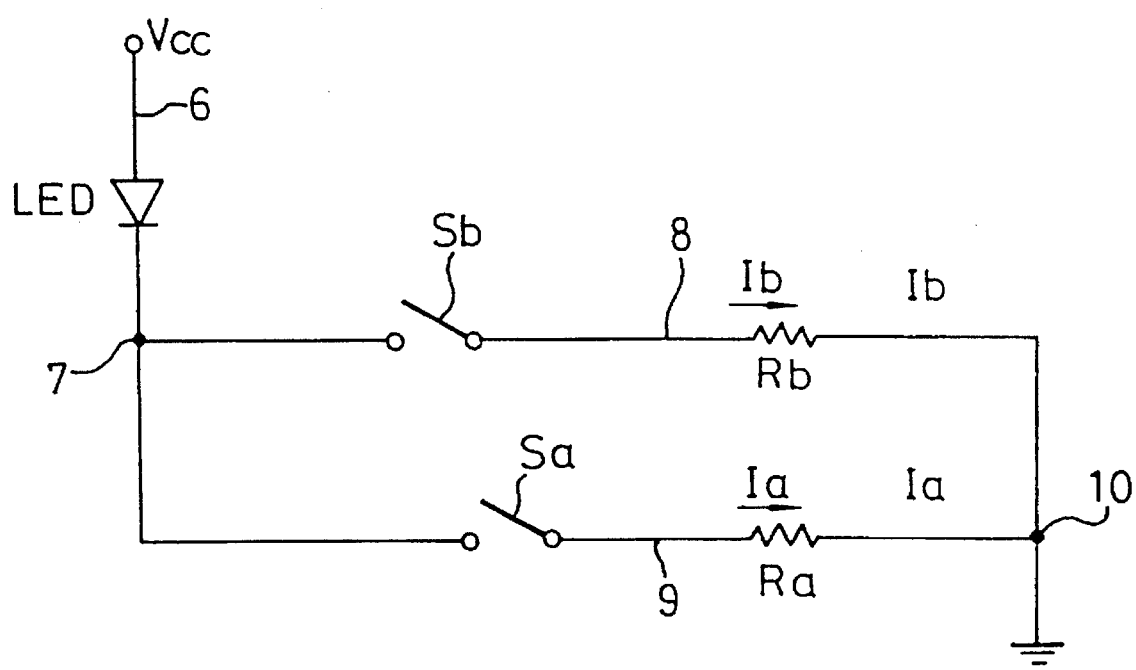
FIG. 4 shows the equivalent circuit of the LED according to the embodiments of the present invention.
Figure 7:
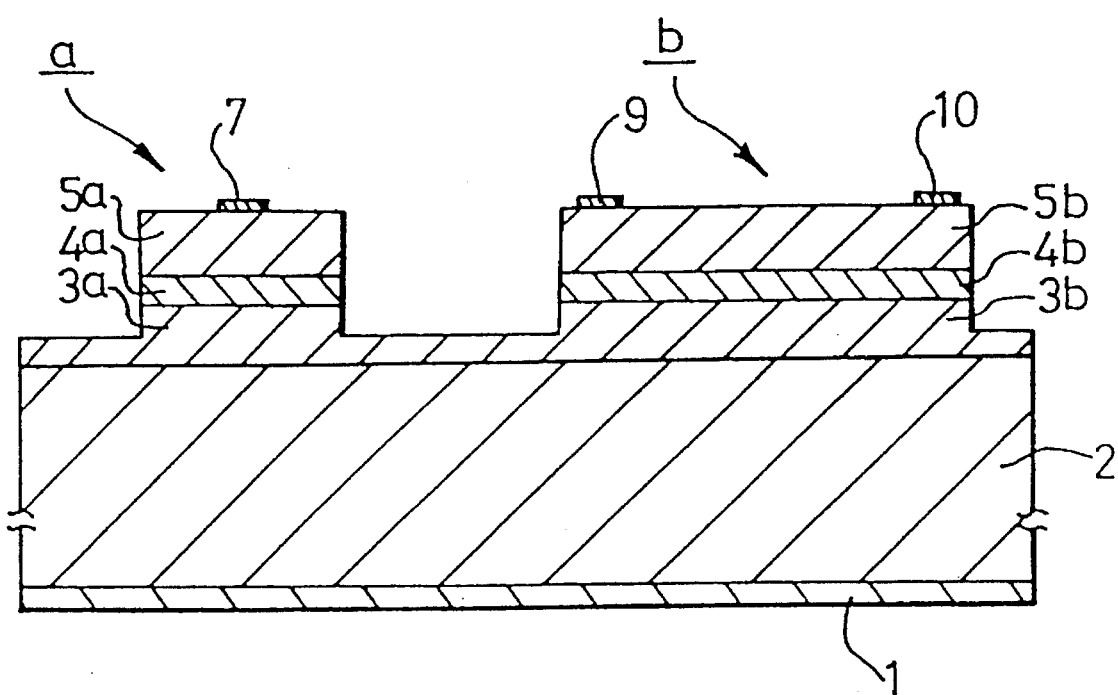
FIG. 7 is a cross-sectional view similar to FIG. 3, but with one of the LED electrode removed.

Referring to FIG. 4, the current through the LED may be varied according to ON/OFF states of two switches Sa and Sb and resistance values of resistors Ra and Rb connected thereto, causing the LED to emit variable intensity light.

If a brake pedal(not illustrated) of a car is not activated during day-time driving, both switches Sa and Sb are determined to be turned OFF and the LED maintains its OFF state.

If the brake pedal of the car is activated during day-time driving, the switch Sa is determined to be turned OFF, while the switch Sb is turned ON. Accordingly, the power supply is fed into the LED through the resistor Rb which resistance value is lower than that of the resistor Ra, and a current of intermediate amount(For example, in case that Ra=4KΩ and Rb=600Ω, Ib≈20 mA.) flows to the LED, causing it to emit light at an intermediate level of intensity. Thus, even in the day-time, a driver in a car to the rear can easily observe the braking state of the car in front.

In the meantime, if the pedal is not activated during night-time driving, the switch Sa is determined to be turned ON while the switch Sb is turned OFF. Accordingly, a current of minimum amount(In the above example, Ib≈3 mA.) flows to the LED through the resistor Ra and the LED emits light at a minimum level of intensity. However, a driver to the rear can easily observe the car in front, as there is no disturbance caused by sunlight.

If the pedal is activated during night-time driving, both switches Sa and Sb are determined to be turned ON. Accordingly, the overall current through the resistors Ra and Rb(In the above example, I=Ia+Ib≈23 mA.) flows to the LED, causing it to emit a light at a maximum level of intensity. Thus, a driver to the rear can easily observe the car in front, even though the light is partially attenuated by the headlights of the cars in the rear.

The fabricating method of the LED with resistors for variable light intensity according to the present invention will now be explained in detail.

In the embodiment of FIG. 2, the P clad layer, the active layer and the N clad layer are successively laminated on the upper surface of the P type substrate 2, and then the layers are partially removed by photoetching, so that the P type substrate 2 is exposed and the remaining P clad layers 3a and 3b, active layers 4a and 4b, and N clad layers 5a and 5b define the LED portion a and the resistor portion b, respectively.

In the embodiment of FIG. 3, the photoetching effects partial exposure of the P clad layer, not of the P type substrate 2. Also, the selective P type electrode 1 may be formed on the bottom surface of the substrate 2 by a conventional method.

Thereafter, the P type electrode 6 is formed on the upper surface of the P type substrate 2(in the embodiment of FIG. 2), or on the upper surface of the P clad layer which remains around the P clad layer 3a of the LED portion a (in the embodiment of FIG. 3).

Also, the N type electrode 7 is formed on the upper surface of the N clad layer 5a as the negative terminal of the LED, and is commonly connected to one terminal of the selection switch Sa for selecting day-time/night-time driving and one terminal of the brake switch Sb. The resistor terminals 9 and 8, which are respectively connected to the other terminals of the switches Sa and Sb, are formed on the upper surface of the N clad layer 5b of the resistor portion b, being positioned to define the corresponding resistance values respectively.

In the embodiments as described above, the shape of the resistor portion b may be varied according to the resistance values desired to be obtained. For example, the resistor portion b may be " " shaped as shown in FIG. 1. In this case, the resistor terminals 8 and 9 are formed at both ends on the upper surface of the N clad layer 5b and the resistor terminal 10 is formed in a position where the distances between the resistor terminals 9 and 10 and between the resistor terminals 8 and 10 correspond to the resistance value(4 KΩ) of the resistor Ra and the value (600Ω) of the resistor Rb, respectively. That is, as shown in FIG. 1, the distance of the path between the electrodes 9 and 10 on the N clad layer 5b is less than the distance of the path between the electrodes 8 and 10. Accordingly, the resistance between the electrodes 9 and 10 is less than the resistance between the electrodes 8 and 10.

According to aging test results for LEDs fabricated with resistors for variable light intensity according to the present invention, a 5% deterioration of the light power occurred at a temperature of 35° C., under a current flow of 36 mA(i.e., current density of 45A/cm ), after 1,000 hour. This result corresponds to a brightness of 1,000 mcd and a lifetime of 100,000 hours or more, at normal temperature, under a current flow of 20 mA.

According to the present invention as described above, the resistors for variable light intensity are fabricated with the LED during the manufacturing process thereof, without requiring any additional process, and-thus, if an LED according to the present invention is used as the brake light of a car, its life may be almost semi-permanent; separate hybrid resistors are not required; its driving circuitry can be simplified; and great reductions in manufacturing costs and power consumption can be achieved.

While the present invention has been described and illustrated herein with reference to the preferred embodiments thereof, it will be understood by those skilled in the art that various changes and revisions, such as kinds of LED, manufacturing processes of the LED, types of the substrate, shapes of the resistor portion corresponding to the resistance values desired to be obtained, etc., may be made therein within the scope of the appended claims.

What is claimed is:

1. A variable light intensity light emitting diode comprising:

a substrate doped with at least one of P-type and N-type dopants, said substrate having a first side and second side which is opposite said first side;

a light emitting diode portion for emitting light having a first active layer formed over said first side of said substrate and a first clad layer formed on said first active layer, said first clad layer being doped with a different type of dopant from that of said substrate and having a first electrode formed on said clad layer, and a second electrode formed on one of said first and second sides of said substrate; and a resistor portion separate from said light emitting diode portion for multistage limitations of current flow to said light emitting diode portion having a second active layer formed on one of said first and second sides of said substrate and a second clad layer doped with a different type of dopant from that of said substrate, and a plurality of resistor electrodes formed on said second clad layer.

2. The light emitting diode according to claim 1, wherein said plurality of resistor electrodes are positioned so that the distances between said resistor electrodes are different.

3. The light emitting diode according to claim 1, wherein said second electrode is formed on said second side.

4. The light emitting diode according to claim 1, wherein said substrate is a semi-insulating substrate.

5. The light emitting diode according to claim 1, further comprising an additional clad layer disposed between said substrate and said first active layer and between said substrate and said second active layer, each of said additional clad layers being doped with the same type of dopant as said substrate.

6. The light emitting diode according to claim 5, wherein said plurality of resistor electrodes are positioned so that the distance between said resistor electrodes are different.

7. The light emitting diode according to claim 5, wherein said second electrode is formed on said second side.

8. The light emitting diode according to claim 5, wherein said substrate is a semi-insulating substrate.

9. The light emitting diode according to claim 5, wherein said resistor portion and said light emitting diode portion are both formed on said first side and wherein portions of said additional clad layer is exposed by photoetching, said first electrode is formed on the exposed portion of said additional clad layer.

10. The light emitting diode according to claim 9, wherein said plurality of resistor electrodes are positioned so that the distance between said resistor electrodes are different respectively.

11. The light emitting diode according to claim 9, wherein said substrate is a semi-insulating substrate.

* * * * *